United States Patent

[11] 3,628,243

[72] Inventors Karl-Heinz Phol
Boulder, Colo.;
Arthur T. Spencer, New Providence;
Robert F. Westover, Princeton, both of N.J.

[21] Appl. No. 876,830
[22] Filed Nov. 14, 1969
[45] Patented Dec. 21, 1971
[73] Assignee Bell Telephone Laboratories, Incorporated
Murray Hill, N.J.

[54] FABRICATION OF PRINTED CIRCUIT
7 Claims, 4 Drawing Figs.

[52] U.S. Cl. .......... 29/625, 72/326, 72/414, 29/626
[51] Int. Cl. .......... B41m 3/08, H05k 3/00
[50] Field of Search .......... 29/625, 626; 72/329, 326, 325, 324, 414; 101/401.1, 32; 161/116, 123

[56] References Cited

UNITED STATES PATENTS

| | | | |
|---|---|---|---|
| 2,366,487 | 1/1945 | Burgess | 72/325 X |
| 2,543,384 | 2/1951 | Squier | 29/625 UX |
| 2,757,443 | 8/1956 | Steigerwalt et al. | 29/625 |
| 2,912,748 | 11/1959 | Gray | 29/625 |
| 3,037,265 | 6/1962 | Kollmeier | 29/625 |
| 3,318,758 | 5/1967 | Tell | 161/216 |
| 3,346,950 | 10/1967 | Schick | 29/625 |
| 2,943,956 | 7/1960 | Robinson | 29/625 UX |

FOREIGN PATENTS

| | | | |
|---|---|---|---|
| 1,259,430 | 11/1963 | Germany | 29/625 |

OTHER REFERENCES

IBM Technical Disclosure Bulletin, Penoyer et al., " Copper Polyethylene Terephthalate Laminate," Vol. 9, No. 7, Dec. 1966.

*Primary Examiner*—John F. Campbell
*Assistant Examiner*—Ronald J. Shore
*Attorneys*—R. J. Guenther and Edwin B. Cave

ABSTRACT: A printed circuit is produced upon a structure including at least one sheet of metal bonded to a sheet of thermoplastic material by shearing off and displacing into the thermoplastic material that portion of the metal sheet which does not constitute part of the printed circuit pattern, thereby leaving on the surface of the thermoplastic material that portion of the metal sheet which constitutes the printed circuit.

INVENTORS K-H. POHL
A.T. SPENCER
R.F. WESTOVER
BY Edward M. Fink
ATTORNEY

FABRICATION OF PRINTED CIRCUIT

This application is a continuation-in-part of copending application, Ser. No. 425,594, filed Jan. 14, 1965.

In recent years, a widely used technique for reducing the size of electrical apparatus and for introduction of mass manufacturing methods has been the substitution of printed circuits for conventional wiring.

Heretofore, the conventional technique for fabricating printed circuits has involved applying a conductive coating to an insulating substrate material and, subsequently, printing the desired circuit pattern thereon by means of conventional photoengraving and etching techniques. Unfortunately, such procedures are not without drawbacks. Important considerations are the amount of time consumed and the inability to completely purge the corrosive etchants employed in the photoengraving procedure. Accordingly, electrical characteristics have often been adversely affected.

In accordance with the present invention, these prior art difficulties may be effectively overcome to a technique wherein a printed circuit is produced upon a structure including at least one sheet of metal bonded to a sheet of thermoplastic material by shearing off and displacing into the thermoplastic material that portion of the metal sheet which does not constitute part of the printed circuit pattern, thereby leaving on the surface of the thermoplastic material that portion of the metal sheet which constitutes the printed circuit. The unused portions of the metal sheet which lie embedded in the thermoplastic material can be left there since for most purposes they will not interfere with the making of electrical connections to, and the subsequent use of, the printed circuit pattern.

For convenience, the invention has been described largely in terms of fabricating a printed circuit upon a laminate structure comprising a thermoplastic core enclosed by a pair of metal skins, such being considered the preferred embodiment. However, it will be understood that the procedural steps delineated in connection therewith can be applied equally as well to a single-sided metal structure.

The invention will be more readily understood by reference to the following detailed description taken in conjunction with the accompanying drawing wherein.

Figure 1:
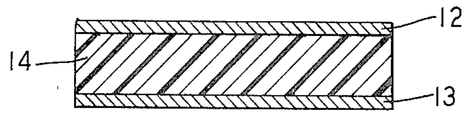
FIG. 1 is a cross-sectional view of an exemplary laminate structure suitable for use in the practice of the present invention.

The first step of the described technique involves preparing a structure in accordance with any convenient technique, as for example the general procedure outlined in copending application, Ser. No. 324,700, filed Nov. 19, 1963.

Initially, one or more metallic body members are selected. Exemplary metals found particularly useful for this purpose are aluminum, copper, beryllium copper, phosphor bronze, stainless steel, et cetera. Following, a body of thermoplastic material is chosen, preferably manifesting a low dielectric constant and high dielectric strength. Suitable materials in this use are polyethylene, polypropylene, acetal plastics, polycarbonates, et cetera.

The thermoplastic material preferably consists of a single resin. It may, however, be a homogeneous mixture which retains the overall thermoplastic properties. A thermoplastic material containing a minor proportion of a material which introduces heterogeneity in the form of fine particles but which still allows the material to retain the ability to be injected into a mold in a conventional thermoplastic molding cycle, may also be used. The body should consist entirely of thermoplastic material, as above defined, at least to the depth to which the sheared metal is displaced. The presence of gross inhomogeneities, such as fibers in this region, will render the body unsuitable for the purposes of the present invention.

In an exemplary procedure, the metal members are next cleansed by vapor degreasing and roughened to a depth ranging up to 0.5 mils by grit blasting or acid etching. Then, the cleansed bodies are etched with a convenient etchant, as, for example, a sulfochromate solution, in order to obtain a chemically active surface. Thereafter, the thermoplastic material, which may or may not include fillers, plasticizers, antioxidants, et cetera, is applied to the metal member or members and the resultant assembly heated to a temperature within the range of 270°–600° F. under an applied pressure of at least 10 pounds per square inch, so resulting in bonding of the metal to the thermoplastic core and formation of the desired structure.

With reference now more particularly to the drawing there is shown a laminate 11 prepared in the above-described manner. The laminate 11 includes a pair of metal body members 12 and 13 bonded to thermoplastic core material 14.

Figure 2:
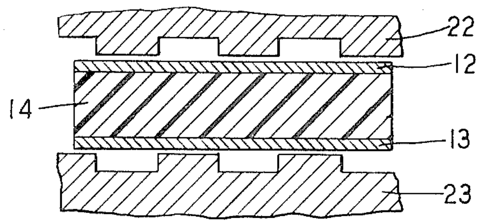
FIG. 2 is a cross-sectional view of a forming die and the structure of FIG. 1 prior to printing.

FIG. 2 is a cross-sectional view of a forming die employed in the fabrication of a desired pattern upon the laminate of FIG. 1. Shown in the figure is a forming tool including an upper die plate 22 and a lower die plate 23 between which rests the laminate of FIG. 1.

Figure 3:
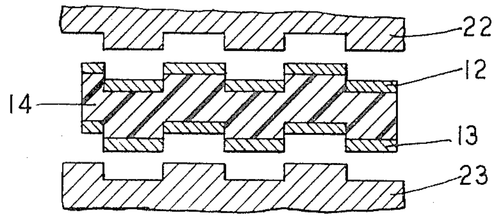
FIG. 3 is a cross-sectional view of the forming die of FIG. 2 and the structure therein at the conclusion of the printing step.

Next, the entire assembly including die plates 22 and 23 and laminate 11 are inserted in any convenient press, either mechanical or hydraulic or in the alternative a roller assembly engraved with the desired pattern is employed, so obviating the necessity for the die plates. Thereafter, the press is actuated and sufficient pressure applied until fracture of the metal skins occurs due to shear stresses caused by advance of the die edges into the laminate. After fracture, pressure is applied until plastic deformation of the core material occurs, so causing separation of the metal skin and the formation of the structure shown in FIG. 3.

The die is able to define a clean, sharp-edged cut in the metal sheet if the elastic modulus of the thermoplastic material is sufficiently high that the yield point of the metal in shear is exceeded when the die penetrates to a depth less than the thickness of the metal sheet and if the yield point of the thermoplastic material in shear is sufficiently high that the thermoplastic material behaves essentially elastically during its initial deformation under the action of the die, up to and preferably beyond the point at which the yield point of the metal in shear is reached.

After failure of the metal sheet in shear, the intrusion of the die is continued under conditions of plastic flow in the thermoplastic material, beyond its yield point. This latter operation insures that the sheared metal will remain embedded in the thermoplastic material, out of electrical contact with the printed circuit pattern on the surface of the thermoplastic material, instead of tending to be restored to its original position by the elastic energy stored in the thermoplastic material.

Polyethylene and polypropylene are particularly desirable thermoplastic materials for the purpose of the present invention. When they are initially at room temperature, and no external heat is supplied to them during the period when elastic deformation is desired under the action of the die, a clean, sharp-edged cut is obtained in the metal sheet, as described above. At higher temperatures, approaching their softening points, the elastic modulus and yield point are reduced, ultimately to the point where the desirable clean shear action is not obtained. Other thermoplastic materials, which yield a clean shear at room temperature, as described above, also exhibit reduced modulus and yield point as the temperature is raised above room temperature until a point is reached at which the criteria for a clean cut cannot be made. Temperatures below room temperature and above the brittle points of the material can of course be used.

It will be understood by those skilled in the art that the degree of pressure required will vary in each case and is dependent upon several factors, as, for example, the nature of the metal skins, the nature of the thermoplastic material, et cetera.

Following, the described pattern may be completed by any convenient procedure, as, for example, by punching holes to receive the components to be soldered to the circuit board. It may also be desirable to remove unwanted metallic areas from the surface of the circuit board and this may be effected by a protective etching procedure wherein the desired conductive paths are protected by any well-known means.

Figure 4:
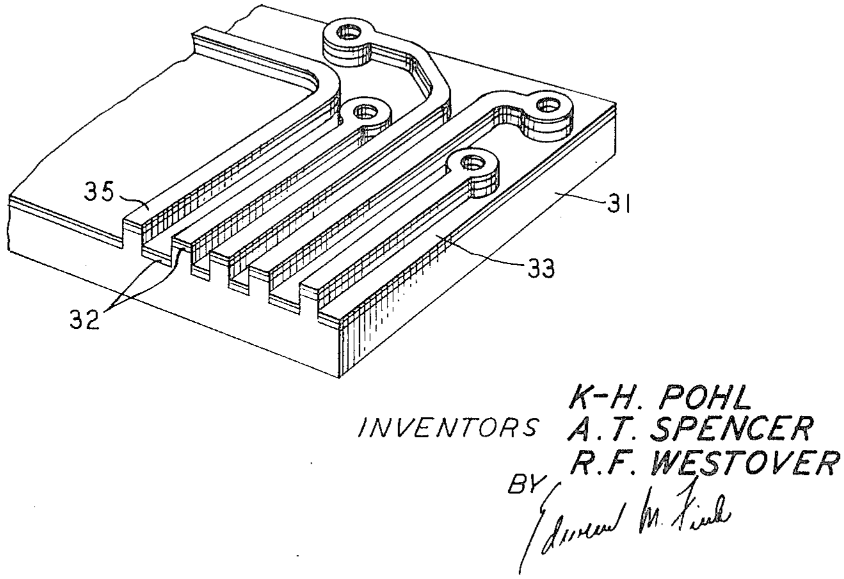
FIG. 4 is a view in perspective of a single-sided printed circuit fabricated in accordance with the inventive procedure.

A typical example of a one-sided printed circuit board is shown in FIG. 4. Shown in the figure is a thermoplastic core material 31 and metal body member 32 bonded thereto. If member 32 is aluminum or other material difficult to solder, it may include a coating of copper 33 to facilitate soldering. A desired pattern 35 is produced upon the structure by the above-described procedure. Finally, a conventional technique is employed to punch holes into the board to receive the leads of an electrical component, the latter being connected, for example, by solder.

An example of the present invention is described in detail below. This example is included merely to aid in the understanding of the invention and variations may be made by one skilled in the art without departing from the spirit and scope of the invention.

EXAMPLE

Two 5×6 inch plates of aluminum having a thickness of 0.004 inch, obtained from commercial sources, were wiped with acetone and vapor cleaned in trichloroethylene. The aluminum plates were then permitted to so remain until no further condensation of trichloroethylene occurred, as noted visually.

One side of each of these plates was then grit blasted with No. 120 mesh steel grit with 35 pounds per square inch air pressure. The grit blast roughened the surfaces to a depth of approximately $2\times10^{-5}$ inch.

Next, the cleansed aluminum plates were etched with a sulfochromate solution prepared by mixing 127.9 grams of commercial grade sodium dichromate ($Na_2Cr_2O_7{\cdot}2H_2O$), one gallon of tap water and 595 milliliters of technical grade sulfuric acid (95 percent, specific gravity 1.84). The aluminum plates were immersed in this etchant for 10 minutes with continuous agitation at 150° F. Upon retraction from the etching solution, the plates were rinsed with tap water and air dried.

Following etching, the surface activity of the aluminum plates was determined by applying a drop of distilled water thereto by means of an eye dropper, the contact angle of the surface being zero and noted by spreading of the drop over a surface area having a diameter within the range of 1–2 centimeters.

A 5×6 inch sheet of polyethylene having a specific gravity of 0.95 g./cm.$^3$ and thickness of 0.125 inch was employed as the core material. This sheet was solvent cleaned to remove residues from its surface.

Next the elements of the laminate were assembled between 0.063 inch caul plates and inserted into a commercial hydraulic press having the platen preheated to 400° F. The press was then closed and 50 pounds per square inch pressure applied for 10 minutes. This pressure squeezed excess molten polyethylene out of the laminate assembly until the caul plates came in contact with tool steel stops restricting the gap between the caul plates to 0.125 inch. The assembly was then cooled under pressure to a temperature of 180° F. after which pressure was released and the laminate permitted to cool to room temperature. After shrinkage of the core, the final laminate thickness was 0.100–0.095 inch.

The laminate (~0.100 inch thick) again was positioned between caul plates which also contained machine tool steel stops of 0.075 inch. The platens of the hydraulic press were reheated to a temperature within the range of 220°–250° F., the laminate-caul plate assembly inserted, the press closed and 1,200–1,500 per square inch pressure applied to the laminate. This high pressure combined with the high viscosity of the polyethylene being squeezed out produced an "ironing effect" which removed all wrinkles from the skin. After cooling, the laminate was ready for production of the printed circuit pattern. This structure was sheared on a commercial shear device to yield 3 inches ×3 inches circuit blanks which were employed in the following manner. Next, die plates 22 and 23 of the tool shown in FIG. 2 together with a 3 inches ×3 inches circuit blank prepared in the described manner were inserted in a hydraulic press and a force of 40 tons applied until fracture of the skins due to shear stresses caused by advance of the die edges into the laminate occurred. Application of pressure was continued until plastic deformation of the core material resulted.

The circuit board was completed by punching holes to receive the leads of the components.

While the invention has been described in detail in the foregoing specification and the drawing similarly illustrates the same, the aforesaid is by way of illustration only and is not restrictive in character. The modifications which will readily suggest themselves to persons skilled in the art are all considered within the broad scope of this invention, reference being had to the appended claims.

We claim:

1. A method for forming a printed circuit upon a laminate comprising a body consisting of thermoplastic material having bonded thereto a sheet of metal thinner than said body, for forcing against the metal sheet a die having the pattern of the desired circuitry recessed therein and having a projecting pattern of the areas not constituting a part of the desired circuitry, causing the die to travel so as to intrude said projecting pattern through said metal sheet while the thermoplastic material is initially at a temperature at which, under the conditions of said travel, its elastic modulus is sufficiently high that the yield point of the metal sheet in sheer is exceeded when the die has penetrated to a depth less than the thickness of the metal sheet and its yield point is sufficiently high that the thermoplastic material behaves essentially elastically during its initial deformation under the action of the die, whereby a pattern of the metal sheet corresponding to said projecting pattern is sheared, inwardly into the thermoplastic material, from the remainder of the sheet, which remains as the printed circuit pattern on the surface of the thermoplastic material, and causing the die to travel a further distance to force said sheared pattern of metal still farther into the thermoplastic material until deformation of the thermoplastic material occurs in plastic flow.

2. The method of claim 1 including the additional step of making electrical connection to the printed circuit on the surface of the thermoplastic material.

3. The method of claim 1 wherein the thermoplastic material consists of polyethylene.

4. The method of claim 3 wherein the metal sheet is formed of aluminum.

5. The method of forming printed circuitry from a laminate comprising a body consisting of a thermoplastic material having bonded thereto a thinner sheet of metal, by forcing against the metal sheet a die having the pattern of the desired circuitry recessed therein and having a projecting pattern of the areas not constituting a part of the desired circuitry, causing the die to travel so as to intrude said projecting pattern through said metal sheet while the thermoplastic material is at a temperature not essentially higher than room temperature, whereby a pattern of the metal sheet corresponding to said projecting pattern is sheared inwardly into the thermoplastic composition from the remainder of the sheet, which remains as the printed circuit pattern on the surface of the thermoplastic material, and causing the die to travel a further distance to force said sheared pattern of metal still farther into the thermoplastic material until deformation of the thermoplastic material occurs in plastic flow.

6. The method of claim 5 wherein the thermoplastic material consists of polyethylene.

7. The method of claim 6 wherein the metal sheet is formed of aluminum.

* * * * *